(12) United States Patent
Nonaka et al.

(10) Patent No.: US 7,996,796 B2
(45) Date of Patent: Aug. 9, 2011

(54) METHOD AND PROGRAM FOR DESIGNING SEMICONDUCTOR DEVICE

(75) Inventors: Makoto Nonaka, Kanagawa (JP); Toshiaki Terayama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 694 days.

(21) Appl. No.: 12/068,660

(22) Filed: Feb. 8, 2008

(65) Prior Publication Data

US 2008/0222588 A1 Sep. 11, 2008

(30) Foreign Application Priority Data

Mar. 5, 2007 (JP) .................................. 2007-054377

(51) Int. Cl.
*G06F 17/50* (2006.01)
(52) U.S. Cl. ........ 716/100; 716/108; 716/111; 716/113; 716/114; 716/119

(58) Field of Classification Search .................. 716/100, 716/104–108, 113–114, 119, 124–126, 134
See application file for complete search history.

(56) References Cited

U.S. PATENT DOCUMENTS

| | | | | |
|---|---|---|---|---|
| 6,311,313 B1 * | 10/2001 | Camporese et al. | ........... | 716/113 |
| 6,351,840 B1 * | 2/2002 | Teng | .................... | 716/7 |
| 6,480,994 B1 * | 11/2002 | Tetelbaum et al. | .............. | 716/10 |
| 7,617,472 B1 * | 11/2009 | Bergendahl et al. | ........... | 716/114 |
| 2007/0157144 A1 * | 7/2007 | Mai et al. | ......................... | 716/10 |

FOREIGN PATENT DOCUMENTS

JP 11-3942 1/1999

* cited by examiner

*Primary Examiner* — Paul Dinh
(74) *Attorney, Agent, or Firm* — McGinn IP Law Group, PLLC

(57) ABSTRACT

A method of designing a semiconductor device is provided. According to the method, a group of cells that is a target of clock distribution is placed. After the group of cells is placed, a plurality of clock driver cells for driving the clock are placed such that each clock driver cell is prohibited from overlapping with a prohibited region of a predetermined size surrounding another clock driver cell.

8 Claims, 6 Drawing Sheets

METHOD AND PROGRAM FOR DESIGNING SEMICONDUCTOR DEVICE

BACKGROUND OF THE INVENTION

1. Field of the Invention

The present invention relates to a technique of designing a semiconductor device. In particular, the present invention relates to a technique of designing a semiconductor device based on a clock tree synthesis method.

This application is based upon and claims the benefit of priority from Japanese patent application No. 2007-054377, filed on Mar. 5, 2007, the disclosure of which is incorporated herein in its entirely by reference.

2. Description of Related Art

In designing a semiconductor device, placement of macro cells and basic cells is performed, and then routing between the cells is performed. The basic cells (primitive cells) include a logic gate cell such as a NAND and an inverter, a clock source cell for supplying a clock, a flip-flop cell that operates based on the clock, and the like.

In a clock design process, it is desirable to reduce clock skew between a plurality of flip-flop cells which are placed in the cell placement process. A method for that purpose is the CTS (Clock Tree Synthesis). According to the CTS, clock driver cells (clock buffer cells) are properly placed such that uniform interconnection lengths from a clock source cell to respective flip-flop cells and uniform clock drive capabilities for the respective flip-flop cells are achieved. Consequently, the clock skew between the flip-flop cells is reduced.

Japanese Laid-Open Patent Application JP-A-Heisei, 11-3942 discloses a layout placement method of a semiconductor device. According to the method, a placement prohibited region is defined around each of the clock source cell, the clock buffer cell and the flip-flop cell. In the cell placement process, each of the clock source cell, the clock buffer cell and the flip-flop cell is treated as having a pseudo size equivalent to the placement prohibited region, and such cells each having the pseudo size equivalent to the placement prohibited region are first placed. Next, logic cells whose power consumption is relatively high are placed. After that, the above-mentioned cells each having the pseudo size are replaced with original cells, respectively. Subsequently, logic cells whose power consumption is relatively low are placed. Consequently, the cells synchronized with a clock signal and the high power consumption cells are prevented from being placed adjacent to each other.

The inventors of the present application have recognized the following point. One of highest consumption current basic cells in a semiconductor chip is the clock driver cell. If the clock driver cells are densely placed, a local current concentration possibly occurs in a power line. The local current concentration causes disconnection due to electromigration and property fluctuation (increase in interconnect resistance) due to Joule heating.

SUMMARY

In one embodiment of the present invention, a method of designing a semiconductor device is provided. The method includes: (A) placing a group of cells that is a target of clock distribution; and (B) placing a plurality of clock driver cells for driving a clock such that each clock driver cell is prohibited from overlapping with a prohibited region of a predetermined size surrounding another clock driver cell, after the (A) step.

In the (B) step, the plurality of clock driver cells are first placed based on a clock tree synthesis method. The plurality of clock driver cells include a first clock driver cell and a second clock driver cell. Next, it is judged whether or not the second clock driver cell overlaps with the prohibited region surrounding the first clock driver cell. If the second clock driver cell overlaps with the prohibited region, the second clock driver cell is displaced outside the prohibited region.

In this manner, according to the present invention, the prohibited region is considered with respect to each clock driver cell, wherein the prohibited region prohibits the placement of another clock driver cell. As a result, the clock driver cells are prevented from being densely placed. Since one of highest consumption current basic cells in a semiconductor chip is the clock driver cell, a local current concentration in a power line is effectively prevented. On the other hand, such a prohibited region is not considered with respect to the group of cells that is the target of the clock distribution. For example, a prohibited region is not considered with respect to the flip-flop cells whose number in the semiconductor chip is remarkably large. Therefore, increase in an area of the semiconductor chip is suppressed.

According to the present invention, it is possible to effectively prevent the local current concentration in the power line. As a result, the disconnection due to the electromigration and the increase in interconnect resistance due to Joule heating can be prevented.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Overall Design Flow

Figure 1:
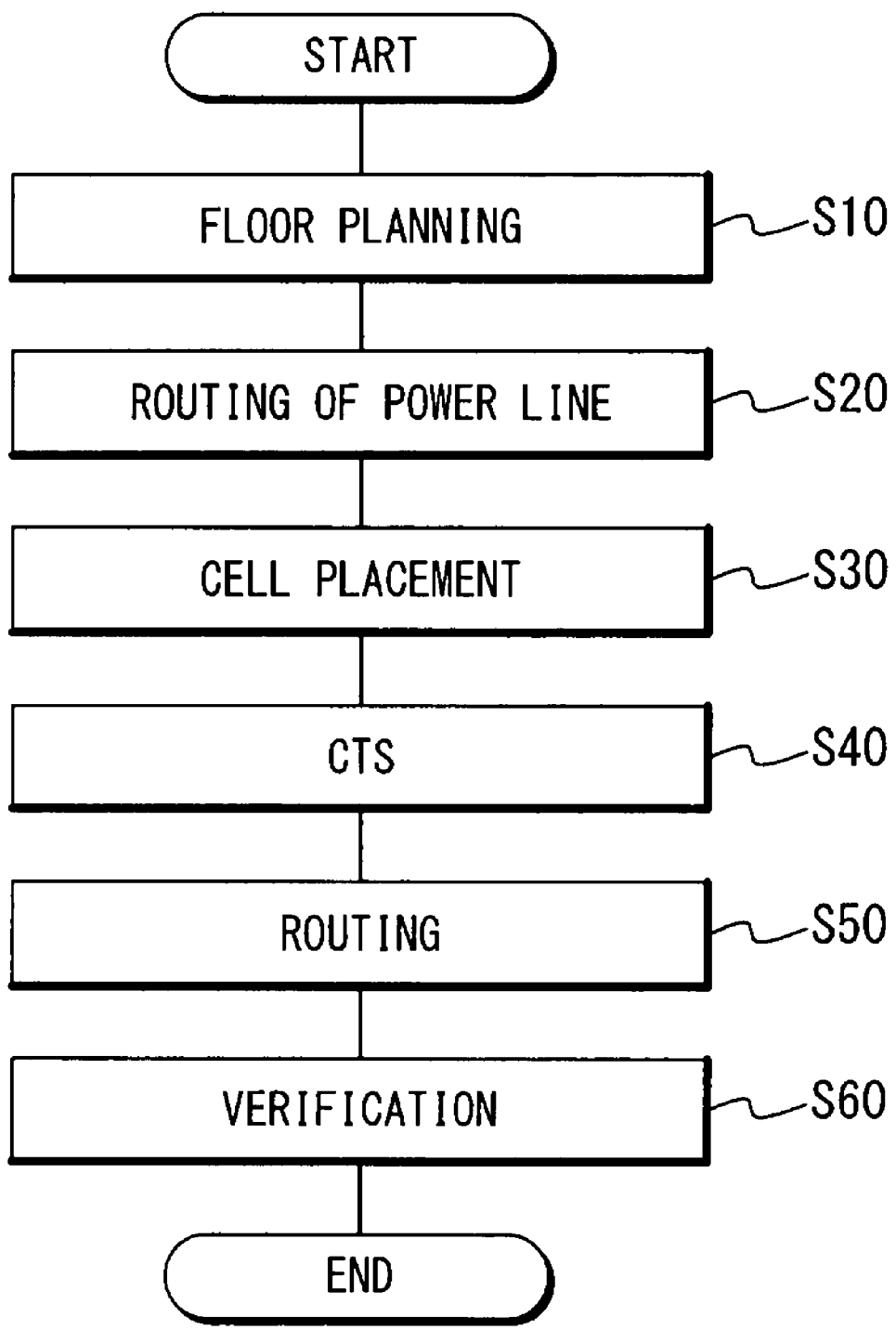
FIG. 1 is a flowchart showing a method of designing a semiconductor device according to an embodiment of the present invention.

FIG. 1 is a flowchart showing a method of designing a semiconductor device according to an embodiment. First, a floor plan is determined and positions of macro cells such as CPU and RAM are determined (Step S10). Next, routing of power lines is performed (Step S20). Here, the power lines include power supply interconnections for supplying a power supply voltage and ground interconnections for supplying a ground voltage.

Next, placement of basic cells is performed (Step S30). The basic cells placed in the present step include a logic gate cell such as a NAND and an inverter, a clock source cell for supplying a clock, a flip-flop cell that operates based on the clock, and the like. In the present stage, the basic cells are placed with some space such that clock drivers and buffers for relaying other signals can be placed later. Next, the clock tree synthesis is carried out (Step S40). According to the clock tree synthesis, a plurality of clock driver cells (clock buffer cells) are placed such that the clock supply to a target of clock distribution is optimized. The clock driver cell is a basic cell for driving the clock. The target of the clock distribution is, for example, a group of flip-flop cells which has been placed in the foregoing Step S30. Next, routing of signal interconnections between the placed cells is performed (Step S50). A clock signal interconnection is also laid-out at this time.

In this manner, a layout of a semiconductor chip under design is determined. When the layout is determined, a layout verification and a timing verification are carried out based on the determined layout (Step S60).

One of highest consumption current basic cells in the semiconductor chip is the clock driver cell. The above-mentioned clock is a signal of high frequency and high operating rate, which determines processing power of a system. The clock driver needs to distribute such the clock to all over the chip, i.e., drive high-load. Therefore, the consumption current of the clock driver becomes higher as compared with the other basic cells. According to estimates under an assumption of a CPU macro based on the 65 nm generation technology, the consumption current of the clock drivers is more than 10 times the consumption current of the other basic cells. Therefore, if the clock driver cells are densely placed, a local current concentration possibly occurs in a power line. Conversely, it is considered that the local current concentration can be effectively prevented by avoiding such a dense placement of the clock driver cells. For that purpose, the above-described Step S40 in the present embodiment has the following characteristics.

2. Clock Design (Step S40)

Figure 2:
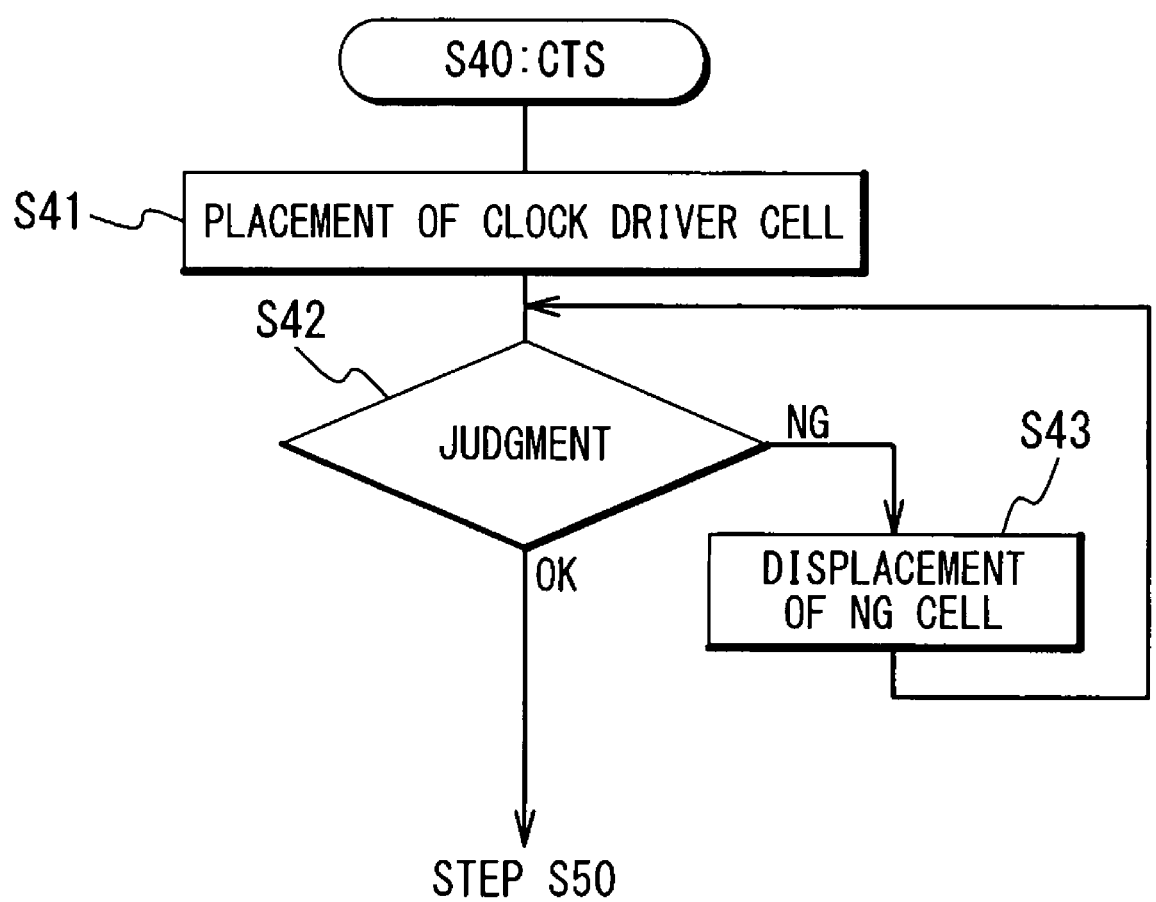
FIG. 2 is a flowchart showing a method of placing clock driver cells in the embodiment of the present invention.
Figure 3:
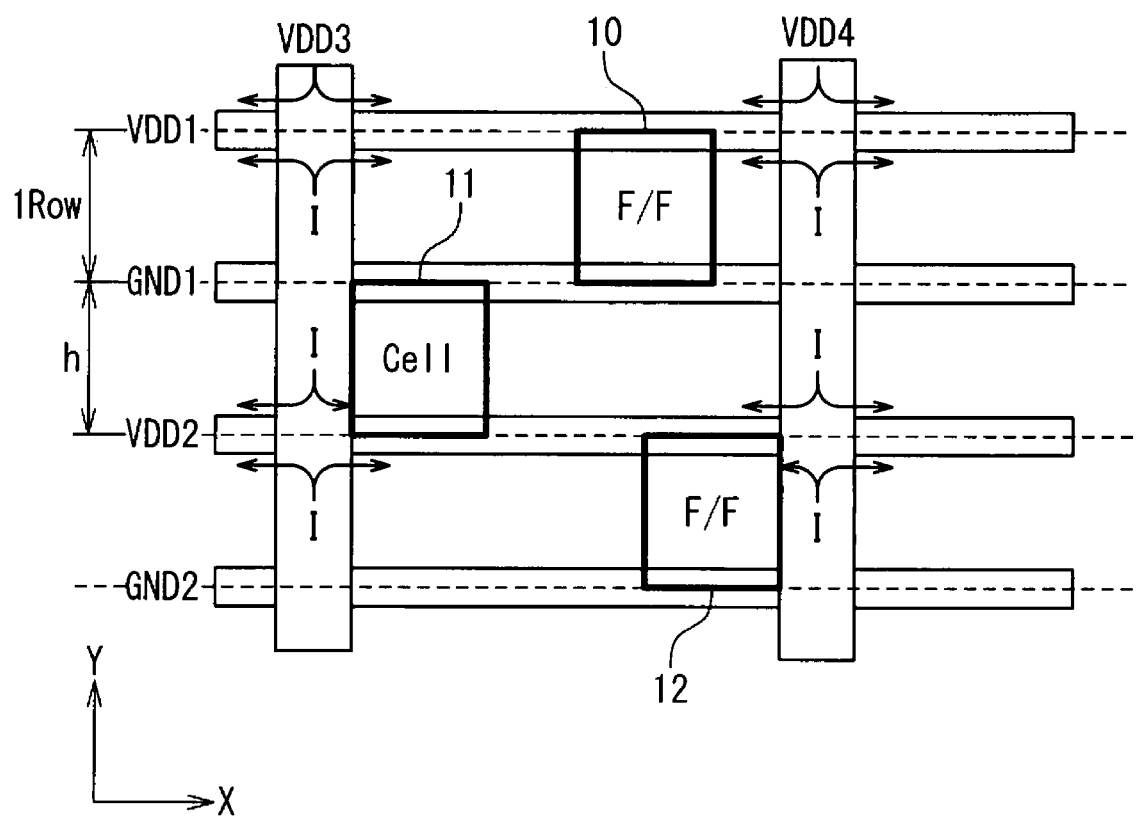
FIG. 3 is a diagram for explaining the placement of the clock driver cells in the embodiment of the present invention.
Figure 4:
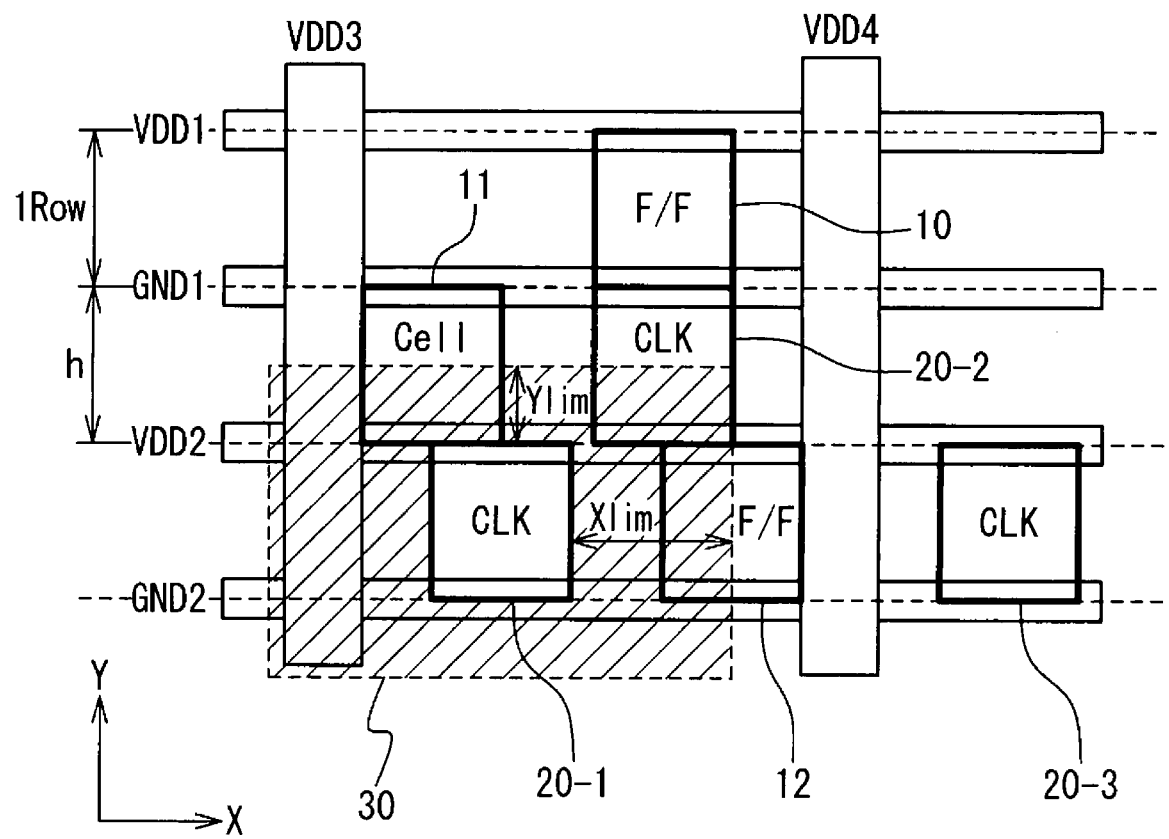
FIG. 4 is a diagram for explaining the placement of the clock driver cells in the embodiment of the present invention.
Figure 5:
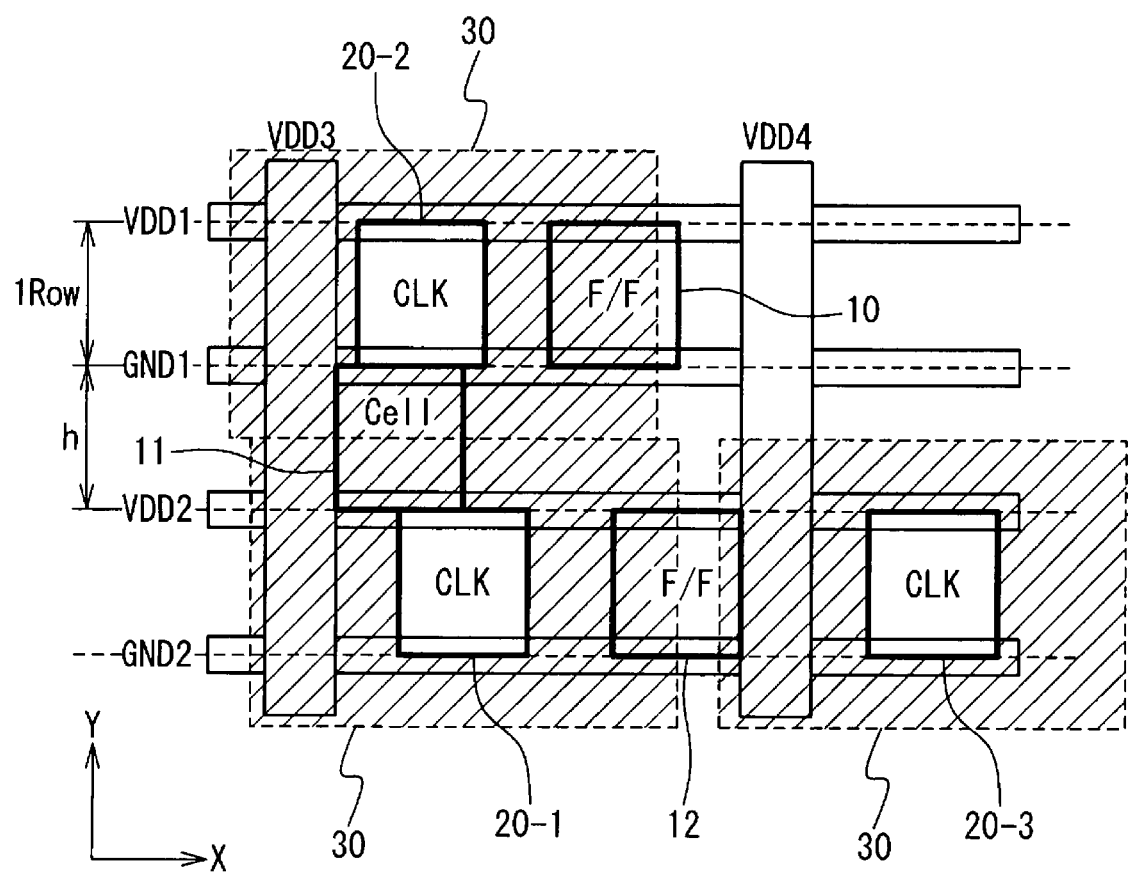
FIG. 5 is a diagram for explaining the placement of the clock driver cells in the embodiment of the present invention.

FIG. 2 is a flowchart showing the processing in Step S40. FIGS. 3 to 5 are diagrams for explaining an example of the placement of the clock driver cells. The placement of the clock driver cells in the present embodiment will be described below in detail with reference to FIGS. 2 to 5.

FIG. 3 shows a state just after Step S30 is completed. In designing a layout of a semiconductor device, a layout region is generally sectioned into strip regions by a plurality of parallel lines. In FIG. 3, the parallel lines (indicated by dashed lines) are drawn along a X-direction at even intervals. One strip region, which is a region between the adjacent two parallel lines, is generally called "ROW". The ROWs are parallel to each other and extends in the X-direction. A Y-direction is perpendicular to the X-direction. A width of one ROW along the Y-direction is represented by "h".

In the foregoing Step S20, the placement of the power supply interconnections and the ground interconnections has been performed. In the example shown in FIG. 3, a power supply interconnection VDD1, a ground interconnection GND1, a power supply interconnection VDD2 and a ground interconnection GND2 are placed in this order on the above-mentioned parallel lines, respectively. That is to say, the power supply interconnections VDD and the ground interconnections GND are alternately placed on the above-mentioned parallel lines. Moreover, power supply interconnections VDD3 and VDD4 are placed along the Y-direction. The illustration of ground interconnections along the Y-direction is omitted. A current I is supplied to the power supply interconnection VDD1 in the X-direction from the power supply interconnections VDD3 and VDD4 in the Y-direction. Similarly, a current I is supplied to the power supply interconnection VDD2 in the X-direction from the power supply interconnections VDD3, VDD4 in the Y-direction.

Furthermore, basic cells 10 to 12 are placed as a result of the foregoing Step S30, as shown in FIG. 3. The basic cells 10 and 12 are flip-flop cells that are the target of the clock distribution. The basic cell 11 is a logic gate cell such as a NAND and an inverter. Each of the basic cells 10 to 12 is placed along any of the "ROWs" extending in the X-direction. That is to say, a width of each basic cell along the Y-direction is equal to the width "h" of the "ROW" along the Y-direction. Consequently, each basic cell is connected to the power supply interconnection and the ground interconnection which are adjacent to each other. For example, the flip-flop cell 10 is connected to the power supply interconnection VDD1 and the ground interconnection GND1, and receives electric power from the power supply interconnection VDD1. The logic gate cell 11 is connected to the power supply interconnection VDD2 and the ground interconnection GND1, and receives electric power from the power supply interconnection VDD2. The flip-flop cell 12 is connected to the power supply interconnection VDD2 and the ground interconnection GND2, and receives electric power from the power supply interconnection VDD2.

Step S40 is performed after the state shown in FIG. 3 is obtained.

Step S41:

First, a plurality of clock driver cells 20 necessary for the clock driving are placed based on the typical clock tree synthesis method. FIG. 4 shows a state in Step S41. In FIG. 4, clock driver cells 20-1, 20-2 and 20-3 among the plurality of clock driver cells 20 are shown.

Each of the clock driver cells 20 is also placed along any of the "ROWs", as in the case of the basic cells 10 to 12. That is to say, a width of each clock driver cell 20 along the Y-direction is equal to the width "h" of the "ROW". Consequently, each clock driver cell 20 is connected to the power supply interconnection and the ground interconnection which are adjacent to each other. For example, the clock driver cell 20-1 is connected to the power supply interconnection VDD2 and the ground interconnection GND2. The clock driver cell 20-2 is connected to the power supply interconnection VDD2 and the ground interconnection GND1. The clock driver cell 20-3 is connected to the power supply interconnection VDD2 and the ground interconnection GND2.

Step S42:

Next, it is judged whether or not the placed clock driver cells are too close to each other. More specifically, a placement prohibited region (placement forbidden region) 30 is considered with respect to each clock driver cell 20. The placement prohibited region 30 is a region that surrounds each clock driver cell 20 and prohibits (forbids) the placement of another clock driver cell 20. For example, the placement prohibited region 30 associated with the clock driver cell 20-1 is illustrated in FIG. 4. The placement prohibited region 30 extends for a width Xlim in the X-direction and a width Ylim in the Y-direction from sides of the clock driver cell 20-1, respectively. That is to say, the placement prohibited region 30 surrounds the clock driver cell 20-1 and has a predetermined size.

In Step S42, it is judged whether or not another clock driver cell 20 overlaps with the placement prohibited region 30. In the case of the example shown in FIG. 4, the clock driver cell 20-2 overlaps with the placement prohibited region 30 associated with the clock driver cell 20-1 (conversely, the clock driver cell 20-1 overlaps with the placement prohibited region 30 (not shown) associated with the clock driver cell 20-2). Therefore, a result of the judgment is NG (Step S42; NG). In this case, the processing proceeds to Step S43.

It should be noted here that the logic gate cell 11 and the flip-flop cell 12 also overlap with the placement prohibited region 30 in the example shown in FIG. 4. However, they are exempt from the prohibition. In other words, neither the logic gate cell 11 nor the flip-flop cell 12 is prohibited from overlapping with the placement prohibited region 30, and the logic gate cell 11 and the flip-flop cell 12 are allowed to overlap with the placement prohibited region 30. The placement prohibited region 30 allows the overlapping of the logic gate cell 11 or the flip-flop cell 12 while prohibits the overlapping of the clock driver cell 20.

Step S43:

The clock driver cell 20-2, which is overlapping with the placement prohibited region 30 in the foregoing Step S42, is displaced to the outside the placement prohibited region 30. FIG. 5 shows a state after the displacement of the clock driver cell 20-2. As compared with the foregoing state shown in FIG. 4, the clock driver cell 20-2 is displaced to the ROW located next to the original one. After the displacement, the judgment is made again (Step S42).

In FIG. 5, respective placement prohibited regions 30 associated with the three clock driver cells 20-1, 20-2 and 20-3 are shown. In the present state, each clock driver cell 20 does not overlap with any of the placement prohibited regions 30. It should be noted that the flip-flop cells 10 and 12 and the logic gate cell 11 can overlap with the placement prohibited region 30. Thus, a result of the judgment becomes OK (Step S42; OK). In this manner, according to the present embodiment, all the necessary clock driver cells 20 are placed such that each clock driver cell 20 is prohibited from overlapping with the placement prohibited region 30.

The followings can be said by comparing FIG. 4 and FIG. 5. In the case of FIG. 4, the power supply interconnection VDD2 within a region between the power supply interconnection VDD3 and the power supply interconnection VDD4 is shared by the two clock driver cells 20-1 and 20-2. That is to say, the power supply interconnection VDD2 within that region needs to supply currents to both of the clock driver cells 20-1 and 20-2. This causes a local current concentration in the power supply interconnection VDD2. In the case of FIG. 5, on the other hand, the power supply interconnection VDD2 within the region between the power supply interconnection VDD3 and the power supply interconnection VDD4 just needs to supply a current to the clock driver cell 20-1. As for the clock driver cell 20-2, a current is supplied from the power supply interconnection VDD1 that is different from the power supply interconnection VDD2. Therefore, the local current concentration can be prevented.

It should be noted in FIGS. 4 and 5 that the clock driver cells 20-1 and 20-3 share the power supply interconnection VDD2. However, the clock driver cells 20-1 and 20-3 are placed on both sides of the power supply interconnection VDD4. Therefore, an extreme current concentration does not occur in a part of the power supply interconnection VDD2.

According to the present embodiment, as described above, congestion of the clock driver cells 20 is prevented. In other words, concentration of a lot of clock diver cells 20 on a part of the power supply interconnection VDD is prevented. As a result, an extreme current concentration in a part of the power supply interconnection VDD is prevented. In particular, since the clock driver cell 20 is the highest consumption current basic cell in the semiconductor chip, the local current concentration is effectively suppressed. Consequently, the disconnection due to the electromigration and the increase in interconnect resistance due to Joule heating can be prevented. Moreover, since the disconnection and the resistance increase due to Joule heating are suppressed, it is possible to reduce the number of power supply interconnections. For example, it is possible to enlarge the interval between the power supply interconnections VDD3 and VDD4 in FIG. 3. Thus, flexibility of the signal routing becomes higher.

Moreover, the followings can be said from FIG. 5. In FIG. 5, the clock driver cells 20-1 and 20-2 are respectively placed in two ROWs on both sides of a certain ROW, namely, the clock driver cells 20-1 and 20-2 are apart from each other by the width "h" along the Y-direction. Since the power supply interconnections VDD and the ground interconnections GND are alternately placed, the clock driver cells 20-1 and 20-2 are connected to different power supply interconnections VDD, respectively, which results in the above-described effects. Conversely, in order to obtain the above-described effects, it is enough to place the clock driver cells 20-1 and 20-2 apart from each other by at least one ROW along the Y-direction. It is not necessary to displace the clock driver cell 20-2 by an excessively large distance. In order to achieve such a processing, it is just enough to set the width Ylim of the placement prohibited region 30 along the Y-direction to at most the width "h" of one ROW. In FIGS. 4 and 5, the width Ylim is set to half the width "h" of one ROW. If the width Ylim is larger than the width "h", the placement prohibited region 30 becomes unnecessarily large. In that case, the plurality of clock driver cells 20 are dispersed over an unnecessarily wide region, which leads to increase in a chip area. In the present embodiment, the width Ylim of the placement prohibited region 30 is set to be equal to or less than the width "h" of one ROW. Therefore, the unnecessary increase in the chip area can be prevented.

Furthermore, according to the present embodiment, the placement prohibited region 30 prohibits the overlapping of the clock driver cell 20 while does not prohibit the overlapping of the flip-flop cell and the like. If the placement prohibited region 30 prohibits the overlapping of the flip-flop cell as well, the following situation can occur. Since the clock designing is carried out in the clock tree synthesis, it is necessary to perform the clock tree synthesis after placing a group of flip-flop cells that is the target of the clock distribution. If the placement prohibited region 30 prohibits the overlapping of the flip-flop cell as well, the placement position of the clock driver cell 20 during the clock tree synthesis is inevitably restricted. That is to say, most of the clock driver cells 20 are forced to be placed apart from preferable positions from a viewpoint of the clock skew. In this case, the clock interconnections become very long, and the clock tree synthesis becomes meaningless. The processing of the clock tree synthesis diverges depending on circumstances. As described above, to involve the flip-flop cell as a placement prohibited object is practically impossible.

Moreover, although the placement prohibited region 30 is considered in placing the clock driver cells 20 (Step S40), such a placement prohibited region is not considered in placing the other cells (Step S30) according to the present embodiment. In other words, a group of basic cells is placed as usual during Step S30. If a placement prohibited region is considered with respect to each flip-flop cell (10, 12) as well, for example, the chip area is increased remarkably. The reason is that the number of flip-flop cells in the semiconductor chip is enormously large. In many cases, the flip-flop cells occupy about 30 to 40% of the total chip area. Therefore, if a similar placement prohibited region is defined with respect to each of the flip-flop cells, the flip-flop cells are inevitably dispersed. This causes a remarkable increase in the chip area. According to the present embodiment, the increase in the chip area is prevented, because such a placement prohibited region is not considered in Step S30.

3. Design System

Figure 6:
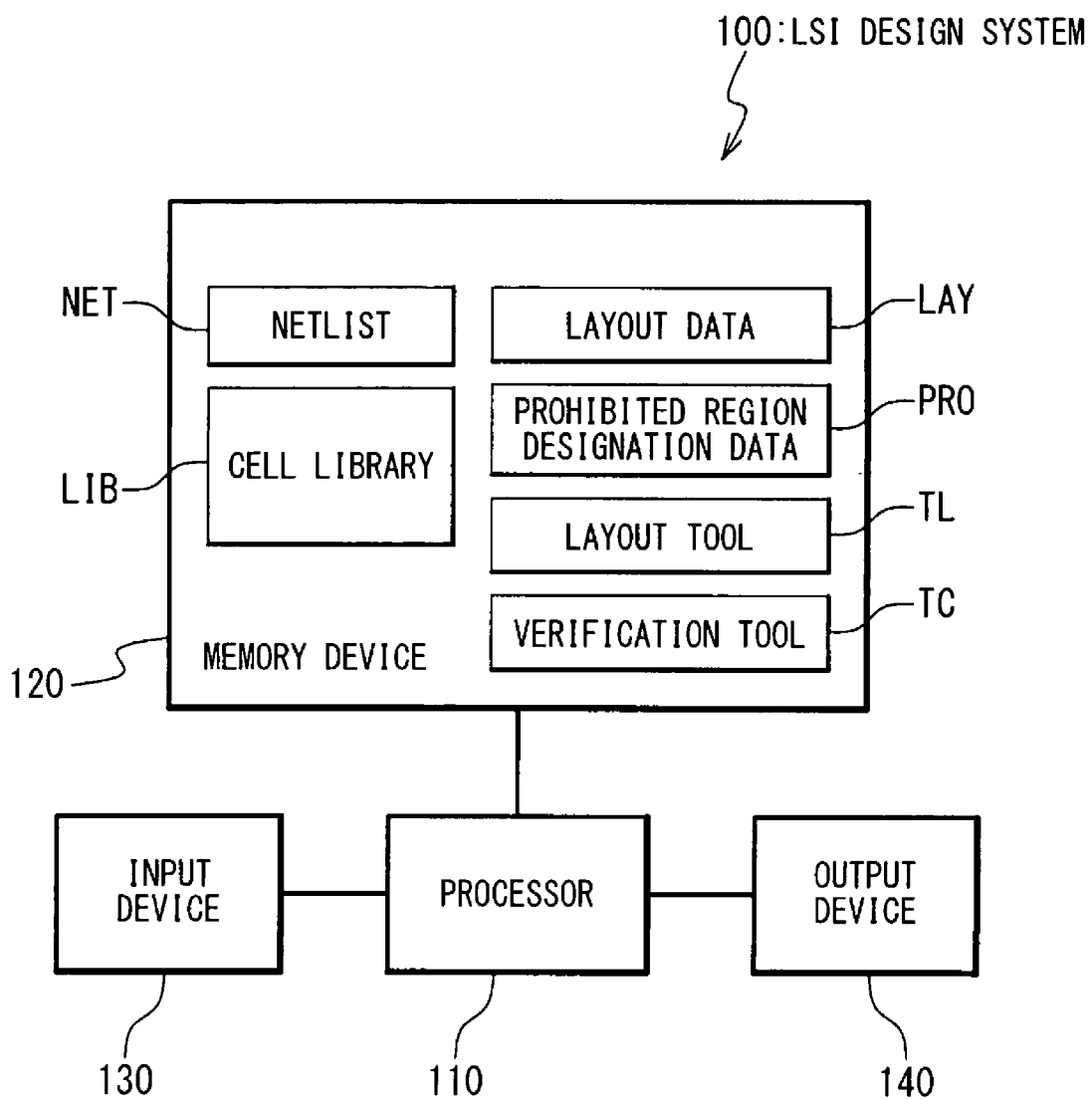
FIG. 6 is a block diagram showing a configuration of an LSI design system according to the embodiment of the present invention.

FIG. 6 shows one example of a configuration of an LSI design system 100 for achieving the design method according to the present embodiment. The LSI design system 100 is provided with a processor 110, a memory device 120, an input device 130 and an output device 140. The processor 110 reads necessary data from the memory device 120 and executes various processing. The memory device 120 includes a RAM and a hard disk drive. The input device 130 includes a keyboard and a mouse. The output device 140 includes a display and a printer.

A netlist NET, a cell library LIB, a layout data LAY and a prohibited region designation data PRO are stored in the memory device 120. The netlist NET indicates connection relationships between cells in the design circuit. The cell library LIB is a database in which data of the macro cells and the basic cells are stored. The layout data LAY indicates a layout of the design circuit. The prohibited region designation data PRO indicates the parameters Xlim and Ylim that specifies the placement prohibited region 30.

Furthermore, a layout tool TL and a verification tool TC are stored in the memory device 120. The layout tool TL and the verification tool TC are computer program products executed by the processor 110. The tools TL and TC may be recorded on a computer-readable recording medium. The processor 110 achieves the design processing according to the present embodiment by executing the layout tool TL and the verification tool TC. In other words, the design processing according to the present embodiment is realized by collaboration of the processor 110 and the tools TL and TC.

Functions of the layout tool TL and the verification tool TC will be described below with reference to FIGS. 1 and 6. First, the layout tool TL executes the floor planning by referring to the netlist NET (Step S10). Then, the layout tool TL executes the routing of the power lines (Step S20). Subsequently, the layout tool TL refers to the netlist NET, reads the necessary cell data from the cell library LIB and executes the cell placement (Step S30). Next, the layout tool TL executes the clock designing (Step S40). At this time, the layout tool TL reads the data of the clock driver cell 20 from the cell library LIB and also uses the parameters Xlim and Ylim indicated by the prohibited region designation data PRO. Next, the layout tool TL refers to the netlist NET and determines a layout of signal interconnections between the placed cells (Step S50). In this manner, a layout of the design circuit is determined and the layout data LAY is produced. After that, the verification tool TC executes the layout verification and the timing verification by using the netlist NET and the layout data LAY. In this manner, the design processing according to the present embodiment is achieved.

It is apparent that the present invention is not limited to the above embodiments and may be modified and changed without departing from the scope and spirit of the invention.

What is claimed is:

1. A method of designing a semiconductor device, the method comprising:
    placing a group of cells that is a target of a clock distribution, as executed by a processor on a computer; and
    placing a plurality of clock driver cells for driving a clock such that each clock driver cell is prohibited from overlapping with a region of a predetermined size surrounding another clock driver cell, after placing said group of cells,
    wherein said placing of said plurality of clock driver cells includes:
        placing said plurality of clock driver cells based on a clock tree synthesis method, wherein said plurality of clock driver cells includes a first clock driver cell and a second clock driver cell;
        judging whether or not said second clock driver cell overlaps with said region surrounding said first clock driver cell; and
        displacing said second clock driver cell to outside said region, if said second clock driver cell overlaps with said region surrounding said first clock driver cell.

2. The method according to claim 1, wherein each of said cells and said plurality of clock driver cells is placed along any of strip regions that are parallel to each other and extend in a first direction perpendicular to a second direction, and
    wherein a width of said region along said second direction is equal to or less than a width of each of said strip regions along said second direction.

3. The method according to claim 2, wherein an interval along said second direction between said second clock driver cell after the displacement and said first clock driver cell is equal to or more than said width of said each strip region.

4. The method according to claim 1, wherein each of said group of cells is allowed to overlap with said region.

5. A computer program product embodied on a non-transitory computer-readable medium that, when executed, causes a computer to perform a method of designing a semiconductor device, said method comprising:
    placing a group of cells that is a target of a clock distribution; and
    placing a plurality of clock driver cells for driving a clock such that each clock driver cell is prohibited from overlapping with a region of a predetermined site surrounding another clock driver cell, after placing said group of cells,
    wherein said placing of said plurality of clock driver cells includes:
        placing said plurality of clock driver cells based on a clock tree synthesis method, wherein said plurality of clock driver cells includes a first clock driver cell and a second clock driver cell;
        judging whether or not said second clock driver cell overlaps with said region surrounding said first clock driver cell; and
        displacing said second clock driver cell to outside said region, if said second clock driver cell overlaps with said region surrounding said first clock driver cell.

6. The computer program product according to claim 5, wherein each of said cells and said plurality of clock driver cells is placed along any of strip regions that are parallel to each other and extend in a first direction perpendicular to a second direction, and
    wherein a width of said region along said second direction is equal to or less than a width of each of said strip regions along said second direction.

7. The computer, program product according to claim 6, wherein an interval along said second direction between said second clock driver cell after the displacement and said first clock driver cell is equal to or more than said width of said each strip region.

8. The computer program product according to claim 5, wherein each of said group of cells is allowed to overlap with said region.

* * * * *